United States Patent
Kim et al.

(10) Patent No.: US 8,143,940 B2
(45) Date of Patent: Mar. 27, 2012

(54) INTERNAL SUPPLY VOLTAGE GENERATING CIRCUIT AND METHOD FOR GENERATING INTERNAL SUPPLY VOLTAGE

(75) Inventors: Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Ji-Wang Lee, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 150 days.

(21) Appl. No.: 12/347,605

(22) Filed: Dec. 31, 2008

(65) Prior Publication Data
US 2010/0164567 A1  Jul. 1, 2010

(30) Foreign Application Priority Data
Dec. 30, 2008 (KR) .................. 10-2008-0137023

(51) Int. Cl.
*G05F 1/10* (2006.01)
*G05F 3/02* (2006.01)

(52) U.S. Cl. ........ 327/539; 327/538; 327/540; 323/312; 323/313

(58) Field of Classification Search .................. 327/530, 327/538–543, 546; 323/312–317
See application file for complete search history.

(56) References Cited

U.S. PATENT DOCUMENTS

| | | | |
|---|---|---|---|
| 6,466,077 B1 | 10/2002 | Miyazaki et al. | |
| 7,321,254 B2 | 1/2008 | Li et al. | |
| 2003/0001639 A1* | 1/2003 | Kim et al. | 327/160 |
| 2003/0030483 A1* | 2/2003 | Seki et al. | 327/540 |
| 2008/0068056 A1* | 3/2008 | Poulton et al. | 327/156 |
| 2008/0186082 A1* | 8/2008 | Singh et al. | 327/539 |
| 2009/0267684 A1* | 10/2009 | Do | 327/540 |

FOREIGN PATENT DOCUMENTS
KR    1020050106893    11/2005

OTHER PUBLICATIONS

Notice of Allowance issued from Korean Intellectual Property Office on Nov. 30, 2010.

* cited by examiner

*Primary Examiner* — Lincoln Donovan
*Assistant Examiner* — Brandon S Cole
(74) *Attorney, Agent, or Firm* — IP & T Group LLP

(57) ABSTRACT

An internal supply voltage generating circuit includes a clock comparator configured to compare a first clock signal having clock information corresponding to a level of a reference voltage with a second clock signal having clock information corresponding to a level of an internal supply voltage, a control signal generator configured to generate a driving control voltage having a voltage level corresponding to an output signal of the clock comparator; and a driver configured to drive a terminal of the internal supply voltage in response to the driving control voltage.

17 Claims, 6 Drawing Sheets

INTERNAL SUPPLY VOLTAGE GENERATING CIRCUIT AND METHOD FOR GENERATING INTERNAL SUPPLY VOLTAGE

CROSS-REFERENCE TO RELATED APPLICATIONS

The present invention claims priority of Korean patent application number 10-2008-0137023, filed on Dec. 30, 2008, which is incorporated by reference in its entirety.

BACKGROUND OF THE INVENTION

The present invention relates to a semiconductor design technology, and more particularly, to an internal supply voltage generating circuit for generating an internal supply voltage using an external supply voltage and a method for generating an internal supply voltage.

In general, a semiconductor device such as a Double Data Rate Synchronous DRAM (DDR SDRAM) includes an internal supply voltage generating circuit. The semiconductor device effectively consumes power and stably operates using various levels of internal supply voltages generated from the internal supply voltage generating circuit. The internal supply voltage includes at least a core voltage generated by down-converting an external voltage and a pumping voltage and a substrate bias voltage that are generated by pumping an external supply voltage.

As semiconductor devices have become more highly integrated, internal circuit of semiconductor devices have been designed at the level smaller than sub-micron level in the dimension. While operation frequencies have been increasing, levels of external supply voltages have been decreasing. Therefore, attempts have been made to generate a stable internal supply voltage by using low external supply voltages.

Figure 1:
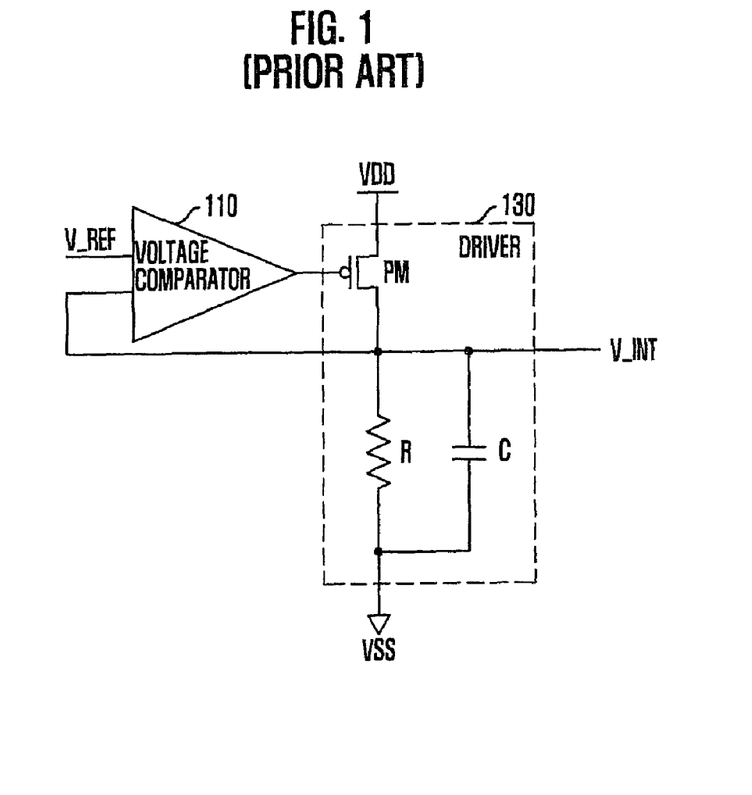
FIG. 1 is a diagram illustrating an internal supply voltage generating circuit according to prior art.

FIG. 1 is a diagram illustrating an internal supply voltage generating circuit according to prior art.

Referring to FIG. 1, the internal supply voltage generating circuit includes a voltage comparator 110 and a driver 130.

The voltage comparator 110 compares a level of a reference voltage V_REF with a level of an internal supply voltage V_INT. In general, the voltage comparator 110 uses a differential amplifier and includes a first input terminal for receiving a reference voltage V_REF and a second input terminal for receiving an internal supply voltage V_INT.

The driver 130 drives a terminal of an internal supply voltage V_INT in response to an output signal of the voltage comparator 110. The driver 130 includes a PMOS transistor PM, a resistor R, and a capacitor C. The PMOS transistor PM forms a source-drain path between an external supply VDD and a terminal of the internal supply voltage V_INT and a gate for receiving an output signal of the voltage comparator 110. The resistor R and the capacitor C is connected between the terminal of the internal voltage supply voltage V_INT and a ground VSS in parallel.

Hereafter, operations of an internal supply voltage generating circuit according to prior art will be described.

When a semiconductor device is operated, a level of an internal supply voltage V_INT is initially lower than that of a reference voltage V_REF. Therefore, the voltage comparator 110 generates a low output signal (that is, the ground VSS). The PMOS transistor PM of the driver 130 is turned on in response to the output signal of the voltage comparator 110 and performs a pull-up operation to pull up a level of the internal supply voltage V_INT to a level corresponding to or at least substantially equal to the external supply voltage VDD. The pull-up operation gradually increases the level of the internal supply voltage V_INT. Such an increased internal supply voltage V_INT is fed back to the voltage comparator 110. The voltage comparator 110 compares the feed-back voltage (that is, internal supply voltage V_INT) with the reference voltage V_REF again. If the level of the internal supply voltage V_INT is higher than that of the reference voltage V_REF, the voltage comparator 110 outputs a high output signal that turns off the PMOS transistor PM. Accordingly, the external supply VDD is stopped from being supplied to the terminal of internal supply voltage V_INT. Thus, when the internal supply voltage (V_INT) reaches a high level, the pull-up operation is stopped.

Meanwhile, a level of the internal supply voltage V_INT may fluctuate in response to power drawn off the terminal of the internal supply voltage V_INT due to operations of the semiconductor device. For example, although the internal supply voltage V_INT is sustained at a level corresponding to or at least substantially equal to the reference voltage V_REF in an operation period, the level of the internal supply voltage V_INT may be lower than the reference voltage V_REF in another operation period in response to power drawn off the terminal of the internal supply voltage V_INT. In this case, the internal supply voltage V_INT can restore a voltage level corresponding to or at least substantially equal to the reference voltage V_REF through the above described operations. A required time for restoring the level of the internal supply voltage V_INT to the level of the reference voltage V_REF after the level of the internal voltage V_INT becomes lower (or higher) than the level of the reference voltage V_REF is referred to as a response time.

Here, the response time corresponds to a response speed of each component within the internal supply voltage generating circuit. That is, a faster response speed of each component means a faster response time. While the response time is not major factor for a semiconductor device having a comparatively low operation frequency, the response time becomes a major factor in a semiconductor device having a comparatively high operation frequency. If the response time is not fit for maintaining the required operation frequency of the semiconductor device, an internal supply voltage V_INT corresponding to or at least substantially equal to the reference voltage V_REF may not be generated within a desired time. Thus, an internal circuit operating at a high operation frequency may not receive a stable internal supply voltage V_INT within a desired time.

Meanwhile, the internal supply voltage generating circuit in FIG. 1 according to prior art has a slow response time due to the below-stated reasons.

First, the PMOS transistor PM of the driver 130 is used to drive the terminal of the internal supply voltage V_INT. Since the terminal of the internal supply voltage V_INT supplies power to other circuits, the PMOS transistor PM is generally designed to have a big size. That is, a capacitance value of the PMOS transistor PM is large compared to that of the voltage comparator 110. Also, a resistor R having a great resistance value is used in order to make a gain of the voltage comparator 110 comparatively large. The above-described large capacitance value of the PMOS transistor PM and the large resistance value of the resistor R make the response speed of the voltage comparator 110 through the PMOS transistor PM and the resistor R to be slow. Such a slow response speed of the voltage comparator 110 slows down the response time of the internal supply voltage V_INT in compensating a voltage decrease (or increase) in the internal supply voltage V-INT.

Due to such a slow response time of prior internal supply voltage generating circuits in compensating a voltage decrease (or increase) in the internal supply voltage VINT, instable internal supply voltage V_INT may be applied to internal circuits of a semiconductor device. Such an instable internal supply voltage often causes errors in semiconductor devices.

SUMMARY OF THE INVENTION

Embodiments of the present invention are directed to providing an internal supply voltage generating circuit for generating an internal supply voltage using clock information corresponding to a level of reference voltage and another clock information corresponding to a level of an internal supply voltage instead of using a differential amplifier.

In accordance with an aspect of the present invention, there is provided an internal supply voltage generating circuit including a clock comparator configured to compare a first clock signal having clock information corresponding to a level of a reference voltage with a second clock signal having clock information corresponding to a level of an internal supply voltage, a control signal generator configured to generate a driving control voltage having a voltage level corresponding to an output signal of the clock comparator, and a driver configured to drive a terminal of the internal supply voltage in response to the driving control voltage.

In accordance with another aspect of the present invention, there is provided an internal supply voltage generating circuit including a first voltage controlled delay line configured to generate a first delayed clock signal by delaying a source clock signal by a first delay time corresponding to a level of an internal supply voltage, a second voltage controlled delay line configured to generate a second delayed clock signal by delaying the source clock signal by a second delay corresponding to a level of a reference voltage, a phase comparator configured to compare a phase of the first delayed clock signal with a phase of the second delayed clock signal to generate a detection signal, a control signal generator configured to generate a driving control voltage having a voltage level corresponding to the detection signal, and a driver configured to drive a terminal of an internal supply voltage in response to the driving control voltage.

In accordance with still another aspect of the present invention, there is provided an internal supply voltage generating circuit including a first voltage controlled oscillator configured to generate a first oscillation signal having a frequency corresponding to a level of an internal supply voltage, a second voltage controlled oscillator configured to generate a second oscillation signal having a frequency corresponding to a level of a reference voltage, a detector configured to detect at least one of phases and frequencies of the first and second oscillation signals, a control signal generator configured to generate a driving control voltage having a voltage level corresponding to an output signal of the detector, and a driver configured to drive the internal supply voltage in response to the driving control voltage.

In accordance with a further aspect of the present invention, there is provided a method for generating an internal supply voltage, including converting a level of an internal supply voltage and a level of a reference voltage to first signal-phase information and second signal-phase information, respectively, comparing the first signal-phase information and the second signal-phase information and generating a detection signal based on the comparison, generating a driving control voltage having a voltage level corresponding to the detection signal, and generating the internal supply voltage in response to the driving control voltage.

In accordance with yet another aspect of the present invention, there is provided a method for generating an internal supply voltage including converting a level of an internal supply voltage and a level of a reference voltage to first frequency information and second frequency information, respectively, comparing the first frequency information and the second frequency information and generating a detection signal based on the comparison, generating a driving control voltage having a voltage level corresponding to the detection signal, and generating the internal supply voltage in response to the driving control voltage.

A response speed of a circuit can be improved by using clock information corresponding to a level of reference voltage and another clock information corresponding to a level of an internal supply voltage instead of using a differential amplifier that has a slow response speed. Furthermore, it is possible to shorten a response time in increasing the level of the internal supply voltage to a level corresponding to the reference voltage through the improvement in the response speed of the circuit.

DESCRIPTION OF SPECIFIC EMBODIMENTS

Other objects and advantages of the present invention can be understood by the following description, and become apparent with reference to the embodiments of the present invention.

Figure 2:
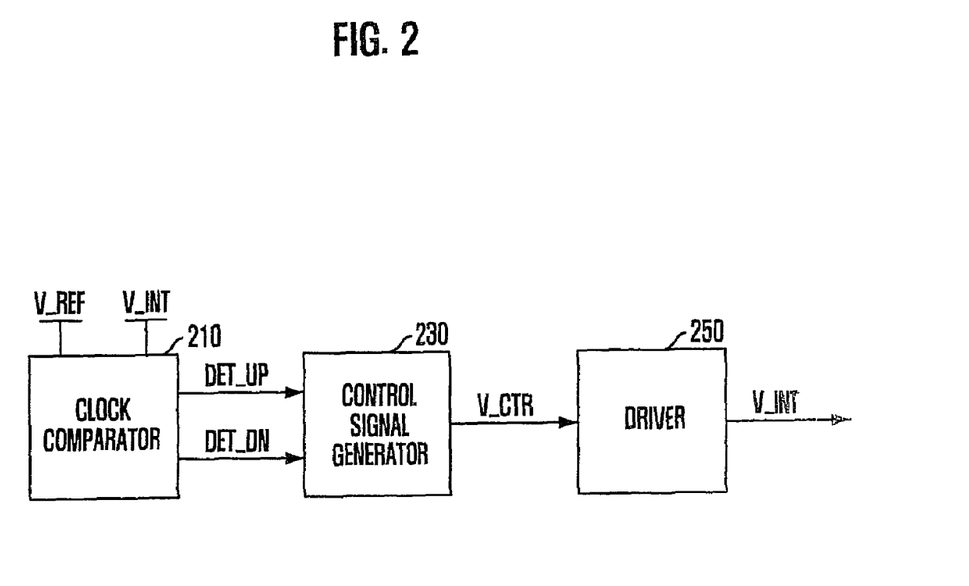
FIG. 2 is a block diagram illustrating an internal supply voltage generating circuit in accordance with an embodiment of the present invention.

FIG. 2 is a block diagram illustrating an internal supply voltage generating circuit in accordance with an embodiment of the present invention.

Referring to FIG. 2, the internal supply voltage generating circuit according to the present embodiment includes a clock comparator 210, a control signal generator 230, and a driver 250.

The clock comparator 210 may generate an up-detection signal DET_UP and a down-detection signal DET_DN, which instruct the control signal generator to pull-up or pull-down the internal supply voltage V_INT, respectively, by comparing clock information (for example, a clock phase or frequency) corresponding to a level of a reference voltage V_REF with clock information corresponding to a level of an internal supply voltage V_INT. The clock comparator 210 internally uses a first clock signal having the clock information corresponding to the level of the internal supply voltage V_INT and a second clock signal having the clock information corresponding to the level of the reference voltage V_REF. The clock information corresponding to the level of the reference voltage V_REF and the clock information corresponding to the level of the internal supply voltage V_INT may each represent pulse widths of the respective clock signal or a delay amount that the respective clock is delayed (for example, a phase delay). Such operations will be subsequently described in detail in connection with FIGS. 3 and 4.

The control signal generator 230 may generate a driving control voltage V_CTR having a voltage level corresponding to the up-detection signal DET_UP and the down-detection signal DET_DN of the clock comparator 210. The up and down detection signals DET_UP and DET_DN generated by the clock comparator 210 have pulse widths corresponding to the above-described clocks of the clock comparator 210. The control signal generator 230 transforms the up and down detection signals DET_UP and DET_DN (which may be digital signals) to an analog voltage signal and outputs the analog voltage as a driving control voltage V_CTR. Such operations of the control signal generator 230 will be subsequently described in detail in connection with FIGS. 5 and 6.

The driver 250 drives the internal supply voltage V_INT in response to the driving control voltage V_CTR. Here, the internal supply voltage V_INT may be generated through a pull-up operation according to a level of the driving control voltage V_CTR. Such operations of the driver 250 will be described in detail in connection with FIGS. 5 and 6.

Figure 3:
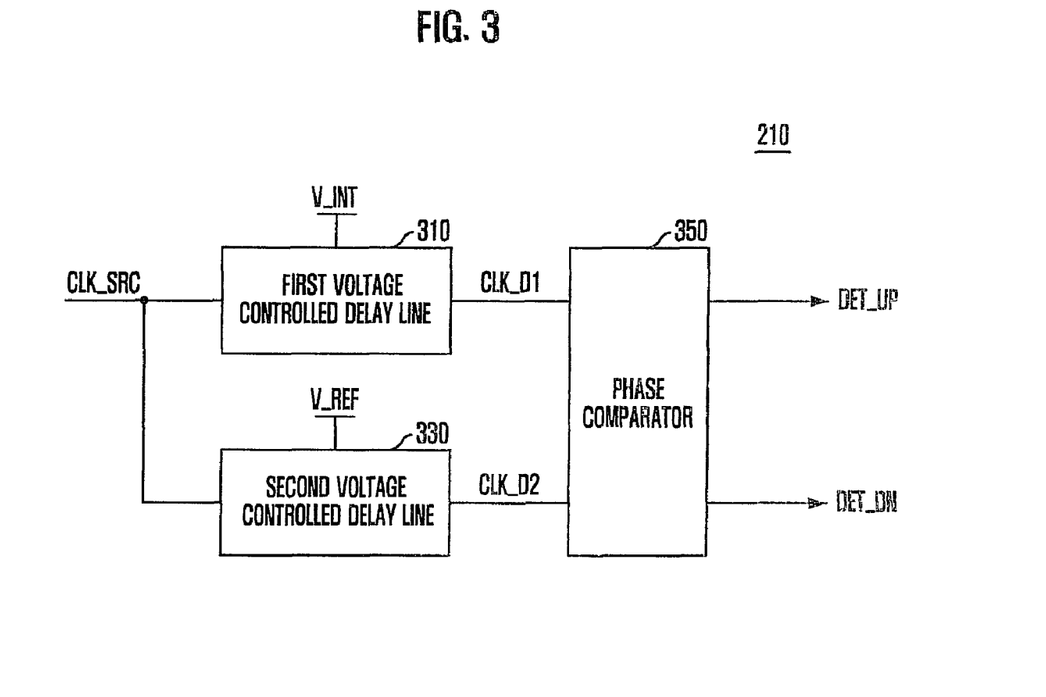
FIG. 3 is a diagram illustrating a clock comparator 210 of FIG. 2 in accordance with a first embodiment of the present invention.

FIG. 3 is a diagram illustrating the clock comparator 210 of FIG. 2 in accordance with a first embodiment of the present invention.

The clock comparator 210 includes a first voltage controlled delay line 310, a second voltage controlled delay line 330, and a phase comparator 350. The first voltage controlled delay line 310 and the second voltage controlled delay line 330 are clock generating circuits which generate a first delayed clock signal CLK_D1 and a second delayed clock signal CLK_D2 in response to the internal supply voltage V_INT and the reference voltage V_REF, respectively.

The first voltage controlled delay line 310 generates the first delayed clock signal CLK_D1 by delaying a source clock signal CLK_SRC by a delay time corresponding (that is, determined in response to or based on) to the level of the internal supply voltage V_INT. The first voltage controlled delay line 310 includes a plurality of delay cells. Each of the plurality of delay cells delays its input signal by a unit delay time. Each of the unit delay times may be adjusted in response to the level of the internal supply voltage V_INT.

The second voltage controlled delay line 330 may generate the second delay clock signal CLK_D2 by delaying the source clock signal CLK_SRC by a delay time corresponding to the level of the reference voltage V_REF. Here, the second voltage controlled delay line 330 may include a plurality of delay cells that each delays its input signal by a unit delay time according to the level of the reference voltage V_REF. It is preferable to design the second voltage controlled delay line 330 to have the same number of delay cells as the number of the delay cells in the first voltage controlled delay line 310.

The phase comparator 350 may output up and down detection signals DET_UP and DET_DN by comparing phases of the first delay clock signal CLK_D1 and the second delay clock signal CLK_D2. Here, the up and down detection signals DET_UP and DET_DN may have a pulse width corresponding a phase difference between the first and second delay clock signals CLK_D1 and CLK_D2.

Hereafter, operations of an internal supply voltage generating circuit according to the first embodiment of the present invention shown in FIG. 3 will be described. While the level of the internal supply voltage V_INT can vary according to operations of the semiconductor device, the reference voltage V_REF can be constantly maintained regardless of that of the semiconductor device.

When power is drawn off the terminal of the internal supply voltage V_INT due to operations of a semiconductor device, the level of the internal supply voltage V_INT decreases. It means that a delay time increases in response to a decrease in the internal supply voltage V_INT in the first voltage controlled delay line 310. That is, a delay of the source clock signal CLK_SRC through the first voltage controlled delay line 310 becomes greater than the delay of the source clock signal CLK_SRC through the second voltage controlled delay line 330. Thus, a phase of the first delay clock signal CLK_D1 falls behind a phase of the second delay clock signal CLK_D2. Then, the phase comparator 350 compares the phases of the first delay clock signal CLK_D1 and the second delay clock signal CLK_D2 and generates up and down detection signals DET_UP and DET_DN each having a pulse width corresponding to the phase difference.

The clock comparator 210 according to the first embodiment of the present invention may convert the level of the internal supply voltage V_INT and the level of the reference voltage V_REF to phase information of the first delay clock signal CLK_D1 and phase information of the second delay clock signal CLK_D2. Then, the clock comparator 210 according to the first embodiment may generate up and down detection signals DET_UP and DET_DN by comparing phases of the first and second delay clock signals CLK_D1 and CLK_D2. Finally, the up and down detection signals DET_UP and DET_DN have information on a difference between the level of the internal supply voltage V_INT and the level of the reference voltage V_REF.

Figure 4:
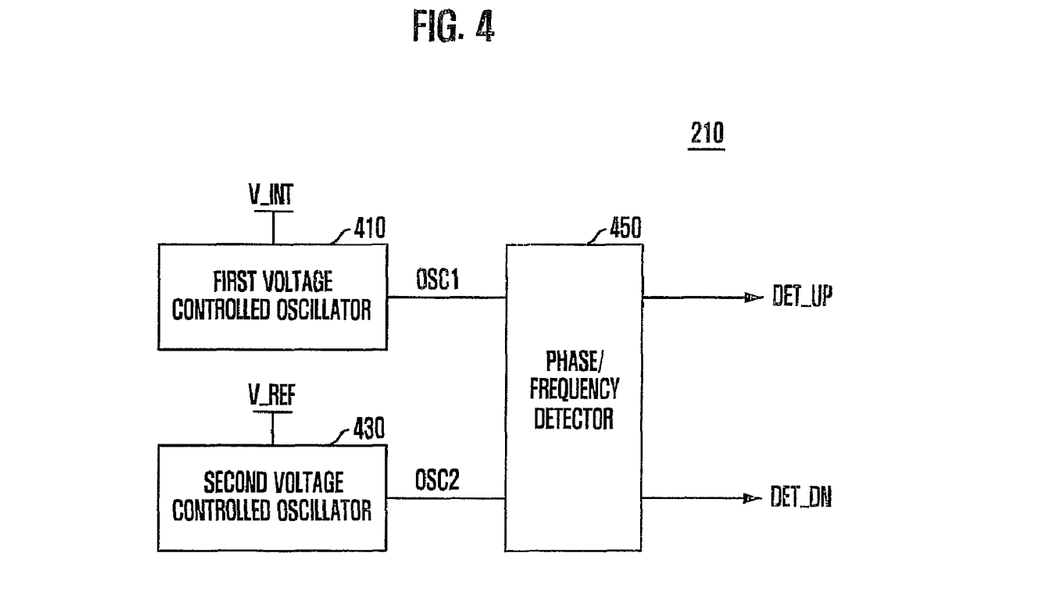
FIG. 4 is a diagram illustrating a clock comparator 210 of FIG. 2 in accordance with a second embodiment of the present invention.

FIG. 4 is a diagram illustrating a clock comparator 210 of FIG. 2 in accordance with a second embodiment of the present invention.

Referring to FIG. 4, the clock comparator 210 may include a first voltage controlled oscillator 410, a second voltage controlled oscillator 430, and a phase/frequency detector 450. The first voltage controlled oscillator 410 and the second voltage controlled oscillator 430 are clock generating circuits which generate a first oscillation signal OSC1 and a second oscillation signal OSC2 in response to the internal supply voltage V_INT and the reference voltage V_REF, respectively.

The first voltage controlled oscillator 410 generates the first oscillation signal OSC1 having a frequency corresponding to the level of the internal supply voltage V_INT and includes a plurality of delay cells for controlling a delay time based on the internal supply voltage V_INT. For example, the first voltage controlled oscillator 410 may be an oscillator having the first oscillation signal OSC1 outputted from the last delay cell being fed back to a first delay cell of the oscillator.

The second voltage controlled oscillator 430 generates the second oscillation signal OSC2 having a frequency corresponding to the level of the reference voltage and includes a plurality of delay cells that control a delay time corresponding to the reference voltage V_REF. It is preferable that the second voltage controlled oscillator 430 is designed to have the same number of delay cells as the number of the delay cells in the first voltage controlled oscillator 410.

The phase/frequency detector 450 may detect phases/frequencies of the first and second oscillation signals OSC1 and OSC2 and output up and down detection signals DET_UP and DET_DN. Here, the up and down detection signals DET_UP and DET_DN may have a pulse width corresponding to a frequency difference between the first and second oscillation signals OSC1 and OSC2.

Hereafter, operations of the clock comparator according to the second embodiment of the present invention will be described.

The level of the internal supply voltage V_INT may decrease when power is drawn off the terminal of the internal supply voltage V_INT from operations of the semiconductor device. It means that the frequency of the first oscillation signal OSC1 controlled by the internal supply voltage V_INT also decreases. That is, the frequency of the first oscillation signal OSC1 becomes lower than the frequency of the second oscillation signal OSC2 controlled by the reference voltage V_REF, and the phase/frequency detector 450 may generate up and down detection signals DET_UP and DET_DN having a pulse width according to the frequency of the first oscillation signal OSC1 and the frequency of the second oscillation signal OSC2.

The clock comparator 210 according to the second embodiment may convert the level of the internal supply voltage V_INT and the level of the reference voltage V_REF to frequency information of the first oscillation signal OSC1 and the second oscillation signal OSC2. Then, the clock comparator 210 may generate up and down detection signals DET_UP and DET_DN by comparing the frequency of the first oscillation signal OSC1 and the frequency of the second oscillation signal OSC2. Similar to the first embodiment, the up and down detection signals DET_UP and DET_DN have information on the level difference between the internal supply voltage V_INT and the reference voltage V_REF.

Figure 5:
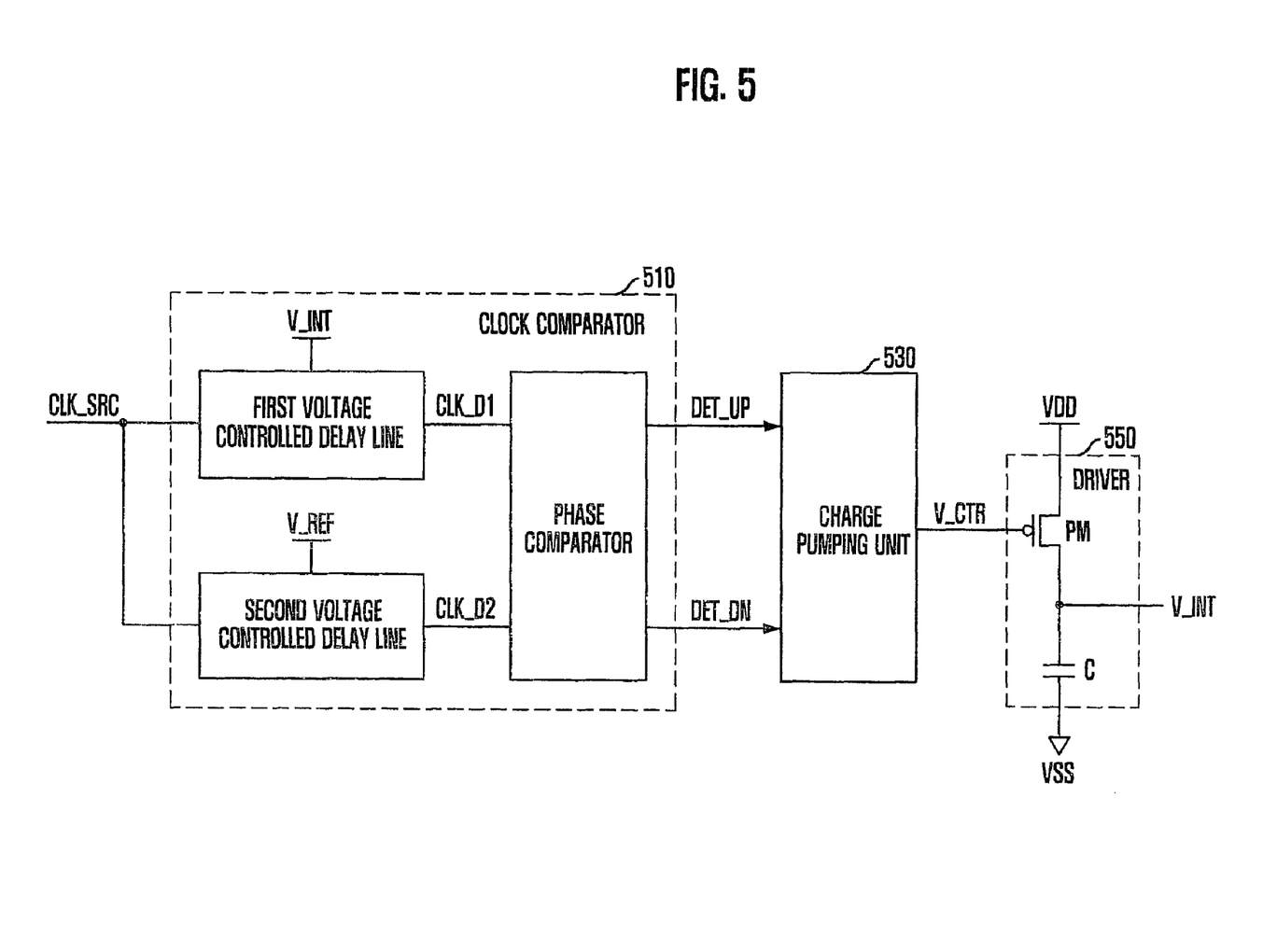
FIG. 5 is a block diagram of an internal supply voltage generating circuit in FIG. 2 to illustrate a control signal generator and a driver in accordance with an embodiment of the present invention.

FIG. 5 is a block diagram of an internal supply voltage generating circuit in FIG. 2 to illustrate a control signal generator and a driver in accordance with another embodiment of the present invention. The control signal generator 230 according to the first embodiment may be formed of a charge pumping circuit.

Referring to FIG. 5, the internal supply voltage generating circuit includes a clock comparator 510, a charge pumping unit 530, and a driver 550. The clock comparator 510 may generate up and down detection signals DET_UP and DET_DN through the same operation described above.

The charge pumping unit 530 may generate a driving control voltage V_CTR through a charge pumping operation in response to the up and down detection signals DET_UP and DET_DN. That is, the clock comparator 510 may generate the up and down detection signals DET_UP and DET_DN based on a phase difference between the clock signals CLK_D1 and CLK_D2, where the phase difference corresponds to a difference in the level of the internal supply voltage V_INT and the level of the reference voltage V_REF. For example, the charge pumping unit 530 decreases the level of the driving control voltage V_CTR in response to the up detection signal DET_UP and increases the level of the driving control voltage V_CTR in response to the down detection signal DET_DN.

The driver 550 drives the terminal of internal supply voltage V_INT in response to the driving control voltage V_CTR. The driver 550 may include a PMOS transistor PM and a capacitor C. The PMOS transistor PM includes a source-drain path between an external supply VDD and the terminal of the internal supply voltage V_INT and a gate for receiving the driving control voltage V_CTR. The capacitor C may be connected to the terminal of the internal supply voltage V_INT and the ground VSS.

Hereafter, operations of the charge pumping unit 530 and the driver 550 will be described.

For example, if the charge pumping unit 530 decreases the level of the driving control voltage V_CTR in response to the up detection signal DET_UP, the PMOS transistor PM of the driver 550 is turned on and increases the level of the internal supply voltage V_INT up to the level of the driving control voltage V_CTR. Then, the down detection signal DET_DN is activated in response to the increased level of the internal supply voltage V_INT. Accordingly, the charge pumping unit 530 increases the level of the driving control voltage V_CTR in response to the down detection signal DET_DN and the driver 550 decreases the level of the internal supply voltage V_INT.

Since the driver 550 according to the present embodiment does not include a differential amplifier type of the voltage comparator 110 (see FIG. 1), it is possible to remove resistance components. Also, the PMOS transistor PM is used as a current source that is controlled by the driving control voltage V_CTR. Therefore, the noise of an external supply voltage VDD does not significantly influence to the internal supply voltage V_INT. Also, the capacitor C reduces abrupt level variation at the terminal of the internal supply voltage V_INT.

Meanwhile, although the clock comparator 210 according to the first embodiment of FIG. 3 was used as the clock comparator 530 of the internal supply voltage generating circuit in FIG. 5, the clock comparator according to the second embodiment shown in FIG. 4 may also be used for the clock comparator 530 as will be described with reference to FIG. 6.

Figure 6:
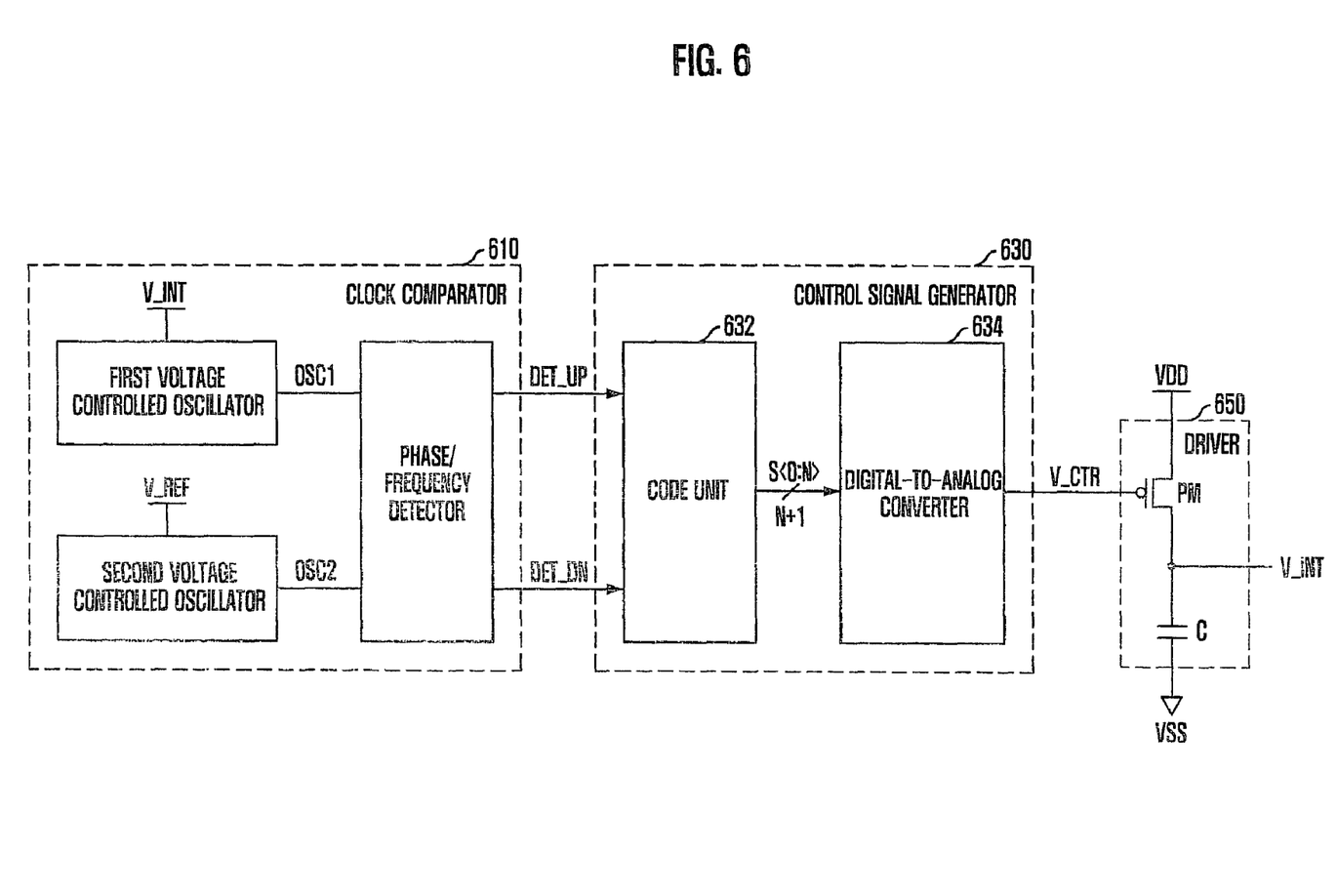
FIG. 6 is a block diagram of an internal supply voltage generating circuit in FIG. 2 to illustrate a control signal generator in accordance with another embodiment of the present invention.

FIG. 6 is a block diagram of an internal supply voltage generating circuit in FIG. 2 to illustrate a control signal generator in accordance with another embodiment of the present invention. Briefly, the clock compactor 610 corresponding to the comparator 210 of FIG. 4 generates the up and down detection signals DET_UP and DET_DN, where the internal supply voltage generation circuit further includes a driver 650.

The clock comparator 610 and the driver 650 may perform the same operation as the comparator 210 and the driver 250 as described above.

The control signal generator 630 includes a code unit 632 and a digital-to-analog converter 634 for generating a driving control voltage V_CTR having a voltage level corresponding to the up and down detection signals DET_UP and DET_DN.

The code unit 632 generates a code corresponding to the up and down detection signals DET_UP and DET_DN. In other words, the code unit 632 may generate a plurality of codes S<0:N> corresponding to the up and down detection signals DET_UP and DET_DN where N denotes a natural number. The code unit 632 may be designed in various ways. Accordingly, a number of the code signals S<0:N> may be changed. For example, the code unit 632 may generate a plurality of the code signals S<0:N> through a shifting operation or a counting operation according to the up and down detection signals DET_UP and DET_DN. Also, the code unit 632 may generate the plurality of code signals S<0:N> through a time to digital converting operation as in FIG. 7.

Figure 7:
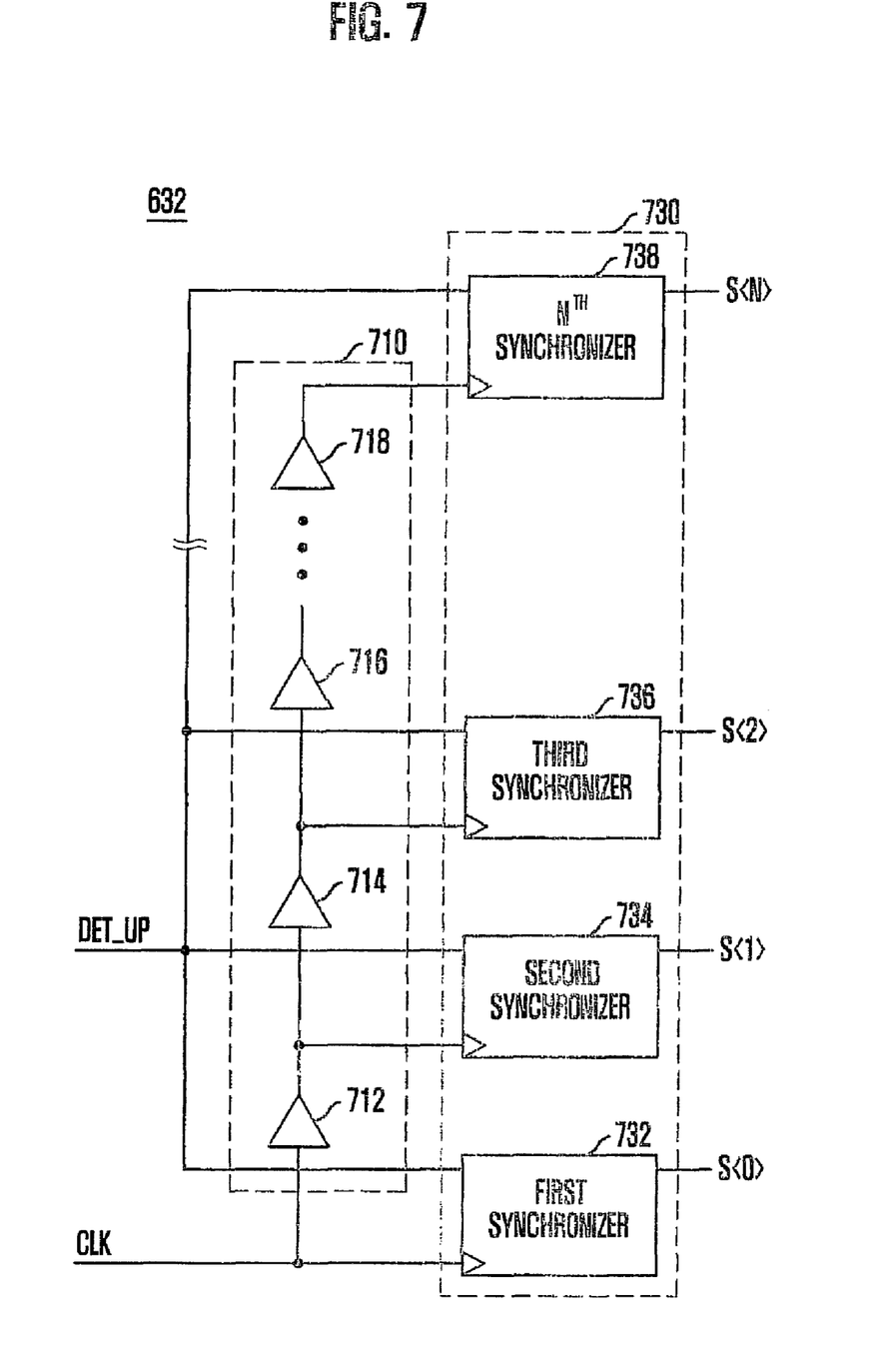
FIG. 7 is a diagram illustrating a code unit 632 of FIG. 6.

FIG. 7 is a diagram illustrating the code unit 632 of FIG. 6. For illustration purposes, operations of the code unit 632 will be described in relation to the up detection signal DET_UP.

The code unit 632 includes a clock delay unit 710 and a synchronizing unit 730 for receiving an up detection signal DET_UP and performing a time to digital converting operation, where the detection signal DET_UP is generated in response to time-related information.

The clock delay unit 710 may include a plurality of first to $N^{th}$ delay units 712, 714, 716, and 718 for sequentially delaying a clock signal CLK. Although the first to Nth delay units 712, 714, 716, and 718 are designed as a buffer, they may be designed as resistors and capacitors.

The synchronizing unit 730 sequentially synchronize the up detection signal DET_UP with output signals that are generated by sequentially delaying the clock signal CLK. The synchronizing unit 730 may include first to $N^{th}$ synchronizers 732, 734, 736, and 738. The first synchronizer 732 outputs a $0^{th}$ code signal S<0> by synchronizing the up detection signal DET_UP with the clock signal CLK, the second synchronizer 734 outputs a first code signal S<1> by synchronizing the up detection signal DET_UP with the output signal of the first delay unit 712, and the third synchronizer 736 outputs a second code signal by synchronizing the up detection signal DET_UP with the output signal of the second delay unit 714.

Figure 8:
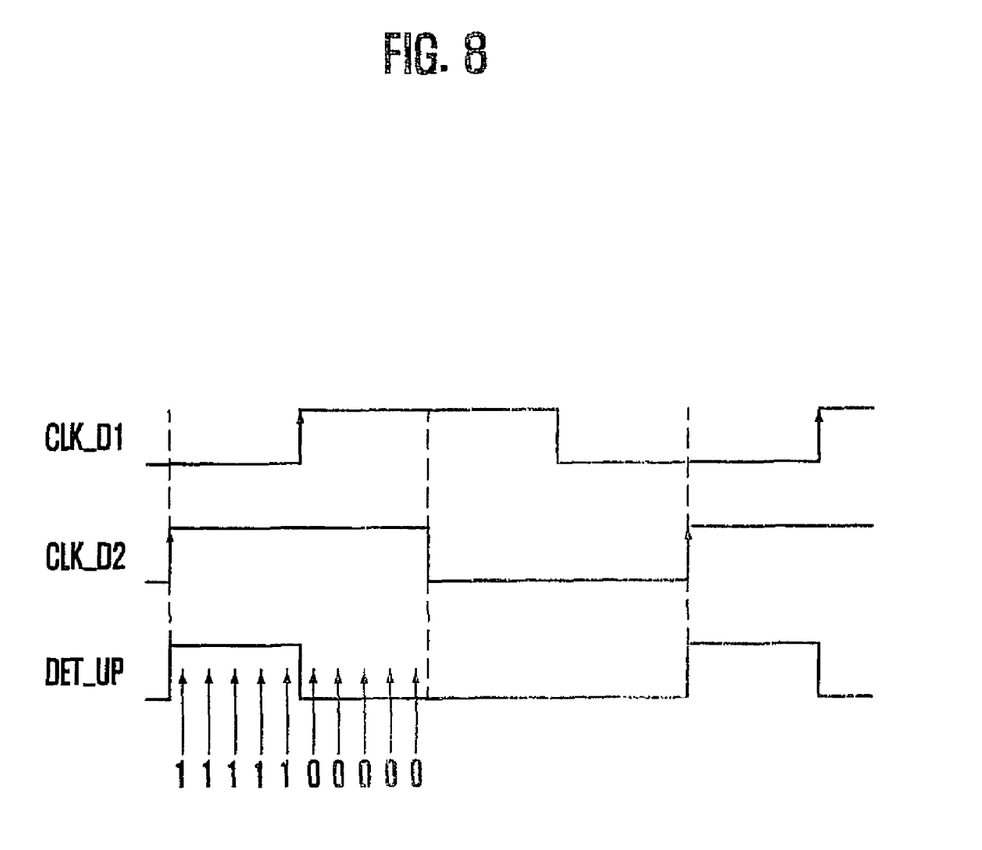
FIG. 8 is a timing diagram for describing an operation timing of a code unit 632 of FIG. 7.

FIG. 8 is a timing diagram for describing an operation timing of a code unit 632 of FIG. 7. For illustration purposes, operation timings of the code unit 632 with respect to the up detection signal DET_UP and the first and second delayed clock signal CLK_D1 and CLK_D2 shown in FIG. 3.

Referring to FIGS. 7 and 8, a phase of the first delayed clock signal CLK_D1 falls behind of the phase of the second delayed clock signal CLK_D2 when the level of the internal supply voltage V_INT becomes lowered. Therefore, the up detection signal DET_UP has a pulse width that spans between a rising edge of the second delay clock signal CLK_D2 and a rising edge of the first delay clock signal CLK_D1.

Meanwhile, the delay unit 710 of the code unit 632 sequentially delays the clock signal CLK and outputs the delayed clock signals, and the plurality of synchronizing units 730 outputs a plurality of code signals S<0:N> by synchronizing up detection signals with the delayed clock signals. That is, the plurality of synchronizing units 730 output a corresponding code signal as a logical 'high' according to a clock signal CLK that is sequentially activated in a period where the up detection signal DET_UP is a logical 'high'. Also, the plurality of synchronizing units 730 outputs a corresponding code signal as a logical 'low' according to a clock signal CLK that is sequentially activated in a period where the up detection signal DET_UP is a logical 'low'. That is, a plurality of code signals S<0:N> are outputted by sensing a pulse width of the up detection signal DET_UP. Thus, it is possible to enable the digital to analog converter 634 to change a weight according to a pulse width of the up detection signal DET_UP. Such a conversion of the pulse width of the up detection signal DEC_UP to a plurality of code signals (S(0:N) can control the driving control voltage V_CTR faster. Alternatively, a method of generating a plurality of code signal S<0:N> through shifting or counting signals may also be used.

In reference to FIG. 6, the digital to analog converter 634 may generate a driving control voltage V_CTR by converting a plurality of code signals S<0:N> to analog signals. The driving control voltage V_CTR may have a voltage level corresponding to a voltage difference between the reference voltage V_REF and the internal supply voltage V_INT. The driver 650 may drive the terminal of the internal supply voltage V_INT in response to the driving control voltage V_CTR.

As described above, the internal supply voltage generating circuit according to the present embodiment generates or adjusts a clock in response to the level of the reference voltage V_REF, generates or adjusts another clock in response to the level of the internal supply voltage V_INT. By comparing the clocks that are varied depending on voltage levels instead of using a differential amplifier, the driving control voltage V_CTR is generated, where the response time of the internal supply voltage generating circuit is reduced. The driving control voltage V_CTR is used to drive the terminal of the internal supply voltage V_INT. The internal supply voltage generating circuit according to exemplary embodiments can improve a response speed and can restore and maintain the internal supply voltage V_INT at a voltage level corresponding to or at least substantially equal to the reference voltage V_REF. Thus, it is possible to supply a stable internal supply voltage V_INT to an internal circuit of a semiconductor device. Furthermore, it is possible to guarantee a stable circuit operation of a semiconductor device.

While the present invention has been described with respect to the specific embodiments, it will be apparent to those skilled in the art that various changes and modifications may be made without departing from the spirit and scope of the invention as defined in the following claims.

Moreover, the logical gates and transistors in the embodiments of the present invention may be modified according to the polarities of input signals.

Embodiments of the present invention relate to an internal supply voltage generating circuit and a driving method thereof for minimizing a response time of an internal supply voltage generating circuit. Therefore, the internal supply voltage generating circuit according to the present invention can provide a stable internal supply voltage in a semiconductor device having a high operation frequency.

Although it is described that the level of the internal supply voltage V_INT is controlled according to operation of the semiconductor memory device in accordance with an embodiment, the semiconductor memory device of the present invention may control the internal supply voltage V_INT according to changes of process, voltage and temperature. Also, the internal supply voltage generating circuit according to the present invention may enable other circuits using the internal supply voltage to stably perform operations by shortening a response time to changes in the internal supply voltage.

What is claimed is:

1. An internal supply voltage generating circuit comprising:
    a clock comparator configured to compare a first clock signal having clock information corresponding to a level of an internal supply voltage with a second clock signal having clock information corresponding to a level of a reference voltage;
    a control signal generator configured to generate a plurality of code signals corresponding to an output signal of the clock comparator and generate a driving control voltage by performing digital-to-analog conversion in response to the plurality of code signals; and
    a driver configured to drive a terminal of the internal supply voltage in response to the driving control voltage,
    wherein the output signal of the clock comparator has information on a pulse width corresponding to a phase difference between the first and second clock signals.

2. The internal supply voltage generating circuit of claim 1, wherein the clock information corresponding to the level of the reference voltage and the clock information corresponding to the level of the internal supply voltage include pulse widths and delay amounts of the first and second clock signals.

3. The internal supply voltage generating circuit of claim 1, wherein the output signal of the clock comparator is generated in response to a voltage difference between the reference voltage and the internal supply voltage.

4. The internal supply voltage generating circuit of claim 1, wherein the control signal generator includes:

a code unit for generating the plurality of code signals corresponding to the output signal of the clock comparator; and a digital-to-analog converter for generating the driving control voltage by performing the digital-to-analog conversion in response to the plurality of code signals.

5. The internal supply voltage generating circuit of claim 4, wherein the code unit generates the plurality of code signals by performing shifting or counting operations in response to the output signal of the clock comparator.

6. The internal supply voltage generating circuit of claim 4, wherein the code unit generates the plurality of code signals by time-digital converting the output signal of the clock comparator.

7. The internal supply voltage generating circuit of claim 4, wherein the code unit includes:

a plurality of clock delay units that are connected in series for delaying a clock signal sequentially; and a plurality of synchronizing units for outputting the plurality of code signals by synchronizing the output signal of the clock comparator with output signals of the clock delay units.

8. The internal supply voltage generating circuit of claim 1, wherein the driver includes a current source controlled in response to the driving control voltage.

9. The internal supply voltage generating circuit of claim 1, wherein the clock comparator includes:

a clock generating unit configured to generate the first and second clock signals in response to the internal supply voltage and the reference voltage, respectively; and a comparing unit configured to compare the first and second clock signals.

10. The internal supply voltage generating circuit of claim 9, wherein the clock generating unit includes:

a first voltage controlled oscillator configured to generate a first oscillation signal which corresponds to the first clock signal and has a frequency corresponding to the level of the internal supply voltage; and a second voltage controlled oscillator configured to generate a second oscillation signal which corresponds to the second clock signal and has a frequency corresponding to the level of the reference voltage.

11. The internal supply voltage generating circuit of claim 10, wherein the comparing unit configured to detect at least one of phases and frequencies of the first and second oscillation signals.

12. A method for generating an internal supply voltage, comprising:

converting a level of an internal supply voltage and a level of a reference voltage to first clock information and second clock information, respectively;

comparing the first clock information and the second clock information and generating a detection signal based on the comparison, wherein the detection signal has information on a pulse width corresponding to a phase difference between signals for the first and second clock information;

generating a plurality of code signals corresponding to the detection signal;

generating a driving control voltage by performing digital-to-analog conversion in response to the plurality of code signals; and generating the internal supply voltage in response to the driving control voltage.

13. The method of claim 12, wherein converting the levels of the internal supply voltage and the reference voltage includes:

generating a first oscillation signal having a frequency corresponding to the level of the internal supply voltage; and generating a second oscillation signal having a frequency corresponding to the level of the reference voltage.

14. The method of claim 13, wherein the detection signal has a pulse width corresponding to a frequency difference between the first and second oscillation signals.

15. The method of claim 12, wherein generating the plurality of code signals includes performing shifting or counting operations in response to the detection signal.

16. The method of claim 12, wherein generating the plurality of code signals is performed by time-digital converting the detection signal.

17. The method of claim 16, wherein the plurality of code signals are outputted by synchronizing the detection signal with sequentially delayed clock signals.

* * * * *